United States Patent
Huang et al.

(10) Patent No.: US 12,482,775 B2
(45) Date of Patent: Nov. 25, 2025

(54) SEMICONDUCTOR STRUCTURE

(71) Applicant: NANYA TECHNOLOGY CORPORATION, New Taipei (TW)

(72) Inventors: Sheng-Fu Huang, New Taipei (TW); Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 674 days.

(21) Appl. No.: 17/818,003

(22) Filed: Aug. 8, 2022

(65) Prior Publication Data
US 2024/0047395 A1 Feb. 8, 2024

(51) Int. Cl.
*H01L 23/00* (2006.01)
*H01L 23/31* (2006.01)
(Continued)

(52) U.S. Cl.
CPC .............. *H01L 24/08* (2013.01); *H01L 24/05* (2013.01); *H01L 25/0657* (2013.01);
(Continued)

(58) Field of Classification Search
CPC ..... H01L 24/08; H01L 24/05; H01L 25/0657; H01L 2224/0235; H01L 2224/02373; H01L 2224/08145; H01L 2224/08146; H01L 2225/06524; H01L 2225/06541; H01L 2924/3511; H01L 23/53295; H01L 23/481; H01L 2224/02372; H01L 2224/05567; H01L 2224/05569; H01L 2224/08147; H01L 2225/06527; H01L 2225/06565; H01L 23/3171; H01L 23/528; H01L 2224/02371; H01L 2224/05573; H01L 23/5227; H01L 21/76885; H01L 23/3114; H01L 24/11; H01L 24/12; H01L 24/16; H01L 24/48; H01L 2224/0401;
(Continued)

(56) References Cited

U.S. PATENT DOCUMENTS 8,008,125 B2 * 8/2011 McConnelee ........... H01L 24/82
438/109
2007/0155186 A1 * 7/2007 Baks ................. H01L 21/02362
257/E21.292
(Continued)

FOREIGN PATENT DOCUMENTS

| TW | 201946233 A | 12/2019 |
|----|-------------|---------|
| TW | 202020998 A | 6/2020 |
| TW | 202230688 A | 8/2022 |

*Primary Examiner* — Sonya McCall-Shepard
(74) *Attorney, Agent, or Firm* — CKC & Partners Co., LLC

(57) ABSTRACT

A semiconductor structure includes a first chip and a second chip bonded to the first chip. The first chip includes a first semiconductor substrate, a first multi-level interconnect structure over the first semiconductor substrate, a first redistribution layer (RDL) over a conductive line of the first multi-level interconnect structure, a compact layer over the first RDL and the first multi-level interconnect structure, a cap layer over the compact layer, and a metal pad on the first RDL. The second chip includes a second semiconductor substrate, a second multi-level interconnect structure over the second semiconductor substrate, and conductive structure extending from the second multi-level interconnect structure to the metal pad.

12 Claims, 12 Drawing Sheets

(51) Int. Cl.
*H01L 23/48* (2006.01)
*H01L 23/528* (2006.01)
*H01L 23/532* (2006.01)
*H01L 25/00* (2006.01)
*H01L 25/065* (2023.01)

(52) U.S. Cl.
CPC ............... *H01L 2224/0235* (2013.01); *H01L 2224/0236* (2013.01); *H01L 2224/02371* (2013.01); *H01L 2224/02373* (2013.01); *H01L 2224/02381* (2013.01); *H01L 2224/024* (2013.01); *H01L 2224/05687* (2013.01); *H01L 2224/08145* (2013.01); *H01L 2224/08146* (2013.01); *H01L 2225/06524* (2013.01); *H01L 2225/06541* (2013.01); *H01L 2924/3511* (2013.01)

(58) Field of Classification Search
CPC . H01L 2224/04042; H01L 2224/04073; H01L 2224/05548; H01L 2224/0236; H01L 2224/024; H01L 2224/05687; H01L 2224/02381
See application file for complete search history.

(56) References Cited

U.S. PATENT DOCUMENTS

| | | | |
|---|---|---|---|
| 2009/0057895 A1* | 3/2009 | Lin | H01L 23/3114 257/737 |
| 2013/0169355 A1* | 7/2013 | Chen | H01L 25/0657 327/564 |

* cited by examiner

SEMICONDUCTOR STRUCTURE

BACKGROUND

Technical Field

The present disclosure relates to a semiconductor structure.

Description of Related Art

With the rapid growth of electronic industry, the development of integrated circuits (ICs) has achieved high performance and miniaturization. Technological advances in IC materials and design have produced generations of ICs where each generation has smaller and more complex circuits than the previous generation.

As the number of electronic devices on single chips rapidly increases, three-dimensional (3D) integrated circuit layouts, or stacked chip designs, have been utilized for certain semiconductor devices in an effort to overcome the feature size and density limitations associated with 2D layouts. Generally, in a 3D IC design, two or more semiconductor chips are bonded together, and electrical connections are formed between the semiconductor chips. When facilitating the chip-to-chip electrical connections, a chip warpage would cause bonding failed. Further, worse surface quality would adversely affect the performance of the chip-to-chip electrical connections.

SUMMARY

One aspect of the present disclosure is a semiconductor structure.

According to some embodiments of the present disclosure, a semiconductor structure includes a first chip and a second chip bonded to the first chip. The first chip includes a first semiconductor substrate, a first multi-level interconnect structure, a first redistribution layer (RDL), a compact layer, a cap layer, and a metal pad. The first multi-level interconnect structure is located over the first semiconductor substrate, and the first multi-level interconnect structure includes a conductive line. The first redistribution layer (RDL) is located over the conductive line of the first multi-level interconnect structure. The compact layer is located over the first RDL and the first multi-level interconnect structure. The cap layer is located over the compact layer. The metal pad is located on the first RDL. The second chip includes a second semiconductor substrate, a second multi-level interconnect structure over the second semiconductor substrate, and conductive structure extending from the second multi-level interconnect structure to the metal pad.

In some embodiments, the compact layer is made of polymer or glass.

In some embodiments, the compact layer has dopants containing nitrogen, hydrogen or oxygen.

In some embodiments, the cap layer is in contact with the compact layer.

In some embodiments, the compact layer has a portion within the first multi-level interconnect structure.

In some embodiments, the compact layer is in contact with the metal pad.

In some embodiments, the first chip further includes a dielectric layer between the compact layer and the first multi-level interconnect structure.

In some embodiments, the cap layer is selected from the group consisting of silicon, carbon, oxygen, and nitrogen.

In some embodiments, the first RDL includes a top portion, a bottom portion, and a neck portion between the top portion and the bottom portion, wherein the top portion is thicker than the bottom portion.

In some embodiments, the neck portion and the bottom portion of the first RDL are within the first multi-level interconnect structure.

In some embodiments, the second chip includes a second RDL over the second multi-level interconnect structure.

In some embodiments, the second chip includes a dielectric layer between the second semiconductor substrate and the cap layer, wherein the dielectric layer and the cap layer include the same materials.

Another aspect of the present disclosure is a semiconductor structure.

According to some embodiments of the present disclosure, a semiconductor structure includes a first chip and a second chip bonded on the first chip. The first chip includes a first semiconductor substrate, a first multi-level interconnect structure, a first redistribution layer (RDL), a compact layer, and a metal pad. The first multi-level interconnect structure is located over the first semiconductor substrate, the first multi-level interconnect structure includes a conductive line. The first redistribution layer (RDL) is located over the conductive line of the first multi-level interconnect structure. The first compact layer is located over the first RDL and the first multi-level interconnect structure, wherein the first compact layer is made of polymer or glass. The first metal pad is located on the first RDL.

In some embodiments, the first compact layer has dopants containing nitrogen, hydrogen or oxygen.

In some embodiments, the second chip further includes a second metal pad on the first metal pad of the first chip.

In some embodiments, the second chip further includes a second RDL over the first RDL of the first chip.

In some embodiments, the second chip further includes a second compact layer surrounding the second RDL.

In some embodiments, the second compact layer is made of polymer or glass.

In some embodiments, the first chip further includes a first cap layer covering the first compact layer, the second chip further includes a second cap layer covering the second compact layer, and the first cap layer is in contact with the second cap layer.

In some embodiments, the second chip further includes a conductive structure extending upward from the second RDL.

In the aforementioned embodiments, since the compact layer is located on the first RDL and the first multi-level interconnect structure and the compact layer has a good reflow (or filling) capability, the compact layer adjacent to the first RDL is free from void. As a result, a chip warpage can be avoided, and thus a surface quality of the chip for bonding process can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
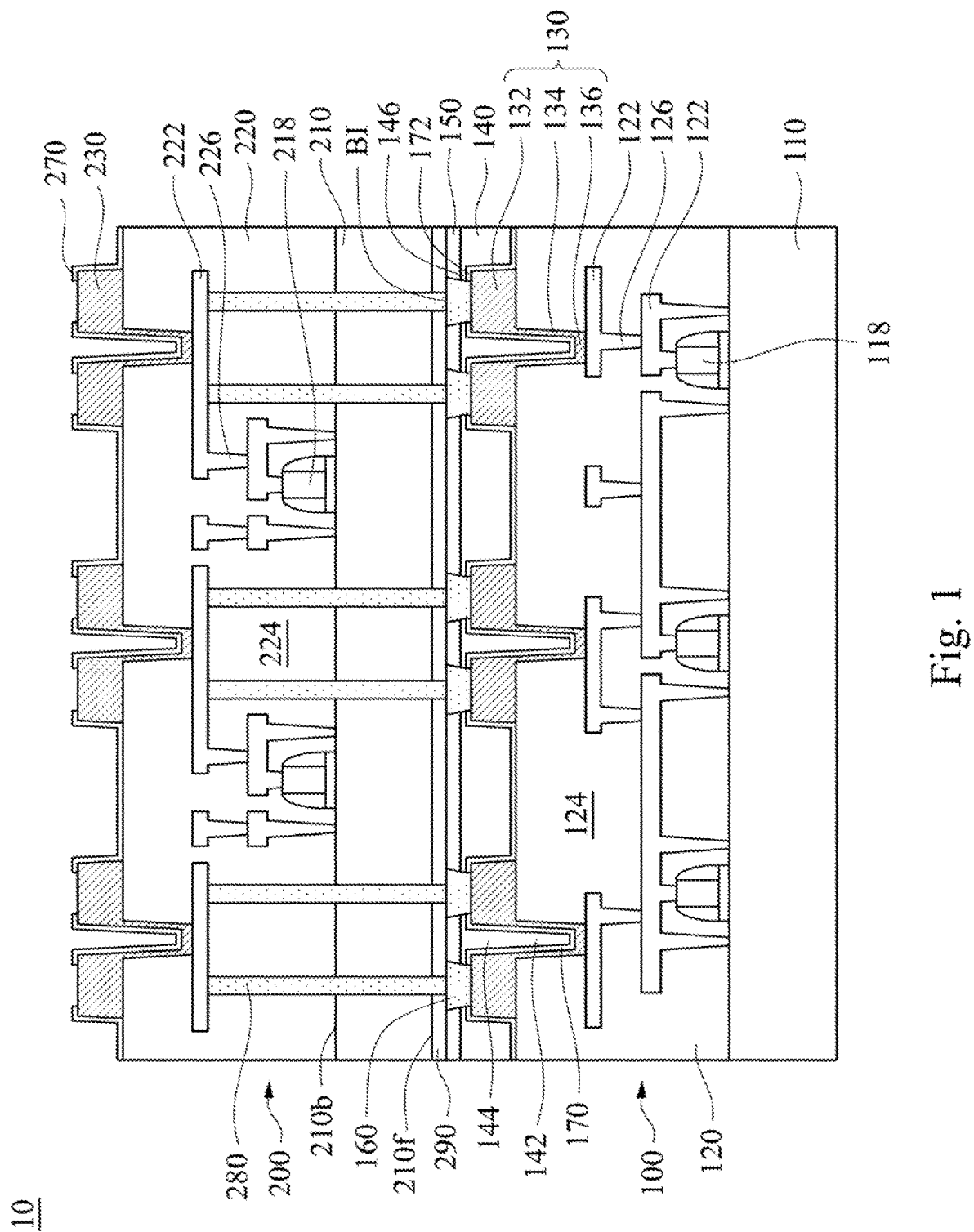
FIG. 1 is a cross-sectional view of a semiconductor structure in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a cross-sectional view of a semiconductor structure 10 in accordance with some embodiments of the present disclosure. Referring to FIG. 1, the semiconductor structure 10 includes a first chip 100 and a second chip 200 over the first chip 100. The first chip 100 includes a first semiconductor substrate 110, a first multi-level interconnect structure 120, a first redistribution layer (RDL) 130, a compact layer 140, a cap layer 150 over the compact layer, and metal pads 160. The second chip 200 is located over and bonded on the first chip 100.

The first chip 100 includes a plurality of devices 118 located on the first semiconductor substrate 110. In some embodiments, the devices 118 are active devices (e.g., transistors or diodes), passive devices (e.g., resistors or capacitors), or combinations thereof.

The first multi-level interconnect structure 120 is located over the first semiconductor substrate 110 and connected to the devices 118. The first multi-level interconnect structure 120 includes a plurality of conductive lines 122 that provide interconnections (wiring) between the devices 118, and between conductive lines 122 themselves. The conductive lines 122 may be insulated from each other by inter-metal dielectric (IMD) layers 124. The first multi-level interconnect structure 120 may further include various conductive vias 126 located within the IMD layers 124 for connecting the conductive lines 122.

The first RDL 130 is located over and extending upward from the conductive line 122 of the first multi-level interconnect structure 120. The first RDL 130 includes top portions 132, a bottom portion 136, and neck portions 134 between and connecting the top portions 132 and the bottom portion 136. Each of the top portions 132 is thicker than the bottom portion 136. The neck portions 134 and the bottom portion 136 of the first RDL 130 are located within the first multi-level interconnect structure 120, while the top portion 132 of the first RDL 130 is located above an entirety of the first multi-level interconnect structure 120. The bottom portion 136 of the first RDL 130 is in contact with and partially overlaps with the conductive line 122 of the first multi-level interconnect structure 120. Each of the neck portions 134 of the first RDL 130 extends upward from the bottom portion 136 of the first RDL 130 and along a sidewall of the first multi-level interconnect structure 120.

The compact layer 140 is located over the first RDL 130 and the first multi-level interconnect structure 120. It is noted that the term of "compact" herein means that the compact layer 140 can provide good filling capability to fully fill a region between the top portions 132 of the first RDL 130. The compact layer 140 may include flowable materials, such as polymer and glass. Since the compact layer 140 surrounds the first RDL 130 and has a good reflow (or filling) capability, the compact layer 140 is free from void therein. For example, void would not be formed in the compact layer 140 between the top portions 132 of the first RDL 130. As a result, chip warpage of the first chip 100 can be avoided, and thus a surface quality of the first chip 100 for bonding process can be improved.

In some embodiments, the compact layer 140 has dopants containing nitrogen, hydrogen and/or oxygen to improve/enhance the bond strength in the compact layer 140. As such, the surface quality of the first chip 100 for bonding process can be improved. In some embodiments, the compact layer 140 is made of polymer, such as epoxy resin, epoxy acrylate, or other suitable materials. In some embodiments, the compact layer 140 is made of glass, such as spin-on glass (SOG). In some embodiments, if a layer overlying and surrounding the first RDL 130 is not made of compact materials (e.g., the layer is made of silicon oxide or other low-k dielectric materials), void would be generated when filling materials in an opening between the top portions 132 of the first RDL 130 due to a high aspect ratio of the first RDL 130, thereby causing chip warpage of the first chip 100.

In some embodiments, the compact layer 140 has a portion 142 within the first multi-level interconnect structure 120. In other words, the portion 142 of the compact layer 140 is directly above the bottom portion 136 of the first RDL 130 and between the neck portions 134 of the first RDL 130. Due to material properties (e.g., having good filling capability) of the compact layer 140, the portion 142 of the compact layer 140 is free from void. The compact layer 140 has another portion 144 directly above the portion 142. The portion 144 of the portion 144 is located directly between the top portions 132 of the first RDL 130 and also directly between the metal pads 160. Due to material properties (e.g., having good filling capability) of the compact layer 140, the portion 144 of the compact layer 140 is free from void.

The cap layer 150 is located over and in contact with the compact layer 140. In some embodiments, the cap layer 150 is selected from the group consisting of silicon, carbon, oxygen, and nitrogen to avoid outgassing. The compact layer 140 may release a gas (e.g., $CO_2$ or $H_2O$) when exposed to heat and or a vacuum. This gas would eventually condense on other materials, and cause worse surface quality of the first chips. As a result, the cap layer 150 can prevent the gas from diffusing to other layers.

The metal pads 160 are located on and electrically connected to the first RDL 130. Each of the metal pads 160 is located in the compact layer 140 and the cap layer 150. Each of the metal pads 160 is in contact with and partially covers the top portion 132 of the first RDL 130. In some embodiments, the first chip 100 further includes a dielectric layer 170 between the compact layer 140 and the first multi-level interconnect structure 120. The dielectric layer 170 covers the first RDL 130 the first multi-level interconnect structure 120. Further, the dielectric layer 170 is in contact with the first RDL 130, the first multi-level interconnect structure 120, the compact layer, and the metal pads 160. In some embodiments, the compact layer 140 is located between the cap layer 150 and the dielectric layer 170. In some embodiments, the dielectric layer 170 has a portion 172 covering a topmost surface of the first RDL 130 and in contact with the metal pad 160. In other words, a portion of the topmost surface of the first RDL 130 is covered by the metal pad 160, and the other portions of the topmost surface of the first RDL 130 is covered by the portion 172 of the dielectric layer 170. The compact layer 140 has a portion 146 in contact with the metal pad 160 and directly between the metal pad 160 and one of the top portions 132 of the first RDL 130. The portion 146 of the compact layer 140 may have a thickness substantially the same as that of the dielectric layer 170. In some embodiments, the first RDL 130 has a concave profile. In greater details, the first RDL 130 has an opening directly above the bottom portion 136, directly between the top portions 132, and directly between the neck portions 134, wherein the dielectric layer 170 is formed in the opening and the compact layer 140 (i.e., the portions 142 and 144 of the compact layer 140) is formed over the dielectric layer and filled in the opening. The sidewalls of the top portions 132, the sidewalls of the neck portions 134 and a top surface of the bottom portion 136 together define the opening and form a concave profile (or bowl-shaped profile).

In some embodiments, each of the metal pads 160 has a bottom portion and a top portion wider than the bottom portion, in which the bottom portion is surrounded by the dielectric layer 170 and the compact layer 140, and the top portion is surrounded by the cap layer 150.

In some embodiments, the second chip 200 includes a second semiconductor substrate 210, a plurality of devices 218, a second multi-level interconnect structure 220, a second RDL 230, a dielectric layer 270, and conductive structures 280.

The conductive structures 280 are located in the second semiconductor substrate 210 and the second multi-level interconnect structure 220. Each of the conductive structure 280 extends from the second multi-level interconnect structure 220 to the metal pad 160. The conductive structures 280 may be referred as through-substrate vias.

The second semiconductor substrate 210 has a front side 210f and a back side 210b opposite to the front side 210f. The devices 218 are located on the back side 210b of the second semiconductor substrate 210. The second chip 200 is bonded to the first chip 100. The front side 210f of the second semiconductor substrate 210 is on the first chip 100.

The second multi-level interconnect structure 220 is located on the back side 210b of the second semiconductor substrate 210 and connected to the devices 218. The second multi-level interconnect structure 220 includes a plurality of conductive lines 222 that provide interconnections (wiring) between the devices 218, and between conductive lines 222 themselves. The conductive lines 222 may be insulated from each other by inter-metal dielectric (IMD) layers 224. The second multi-level interconnect structure 220 may further include various conductive vias 226 located within the IMD layers 224 for connecting the conductive lines 222. Configurations regarding the second semiconductor substrate 210, the devices 218, and the second multi-level interconnect structure 220 (including the conductive lines 222, the IMD layers 224 and the conductive vias 226) of the second chip 200 are similar to or the same as the first semiconductor substrate 110, the devices 118, and the first multi-level interconnect structure 120 (including the conductive lines 122, the IMD layers 124 and the conductive vias 126) of the first chip 100, and, therefore, a description in this regard will not be repeated hereinafter.

The second RDL 230 is located over the conductive line 222 of the second multi-level interconnect structure 220. The dielectric layer 270 is located over and covers the second RDL 230. Configurations regarding the second RDL 230 and the dielectric layer 270 of the second chip 200 are similar to or the same as the second RDL 230 and the dielectric layer 170 of the first chip 100, and, therefore, a description in this regard will not be repeated hereinafter.

FIGS. 2-8 are cross-sectional views of a method of forming the semiconductor structure 10 of FIG. 1 at various stages in accordance with some embodiments of the present disclosure.

Figure 2:
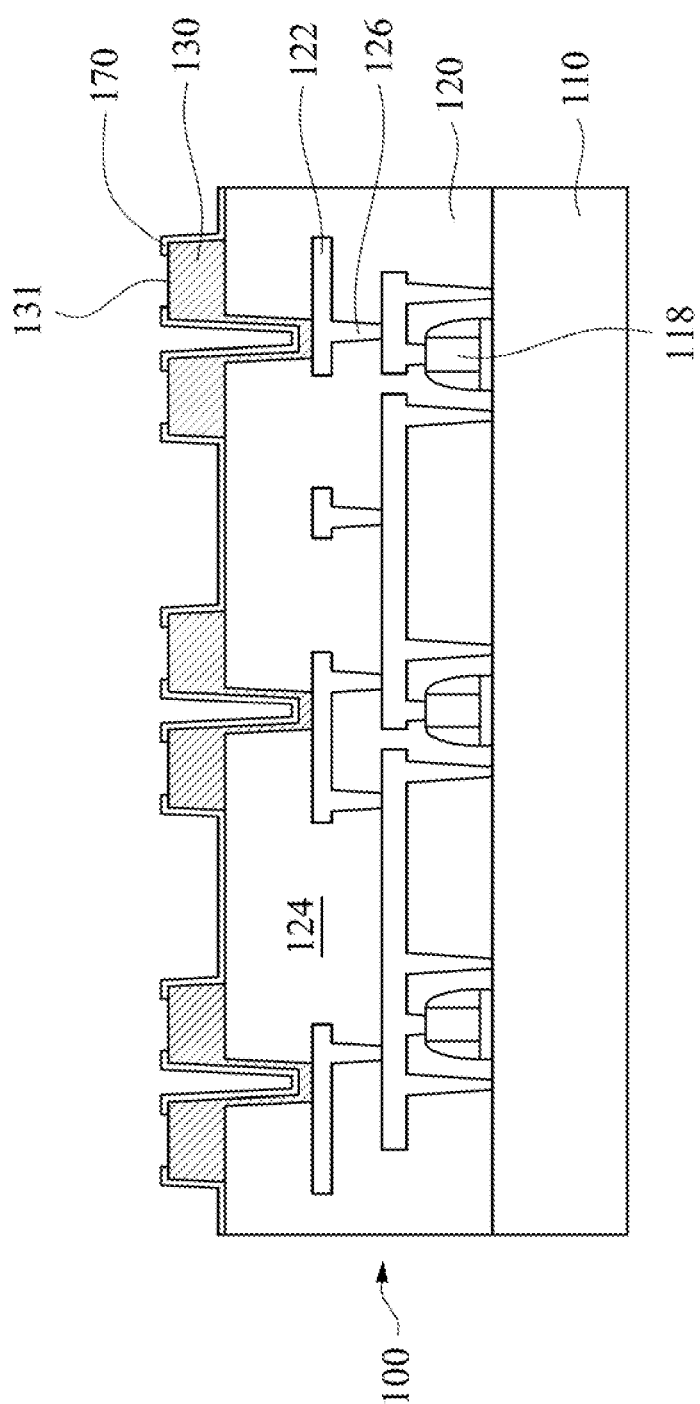
FIGS. 2-8 are cross-sectional views of a method of forming the semiconductor structure at various stages in accordance with some embodiments of the present disclosure.

Referring to FIG. 2, the first chip 100 includes the first semiconductor substrate 110, the devices 118, the first multi-level interconnect structure 120, the first RDL 130 and the dielectric layer 170. The first semiconductor substrate 110 includes an elementary semiconductor, such as germanium, or silicon; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The devices 118 are formed over the first semiconductor substrate 110, and the first multi-level interconnect structure 120 is formed above the devices 118. The first multi-level interconnect structure 120 includes the conductive lines 122, the IMD layers 124, and the conductive vias 126. The IMD layers 124 may be made of silicon oxide, silicon nitride, silicon oxynitride, or other suitable materials.

The first RDL 130 is formed over the first multi-level interconnect structure 120, and the dielectric layer 170 is formed over the first RDL 130. In some embodiments, the first RDL 130 includes copper (Cu), aluminum (Al), or other suitable materials. In some embodiments, the dielectric layer 170 includes silicon oxide, silicon nitride, silicon oxynitride, or other suitable materials. After the dielectric layer 170 is formed, a portion of the dielectric layer 170 is removed to expose a topmost surface 131 of the first RDL 130.

Figure 3:
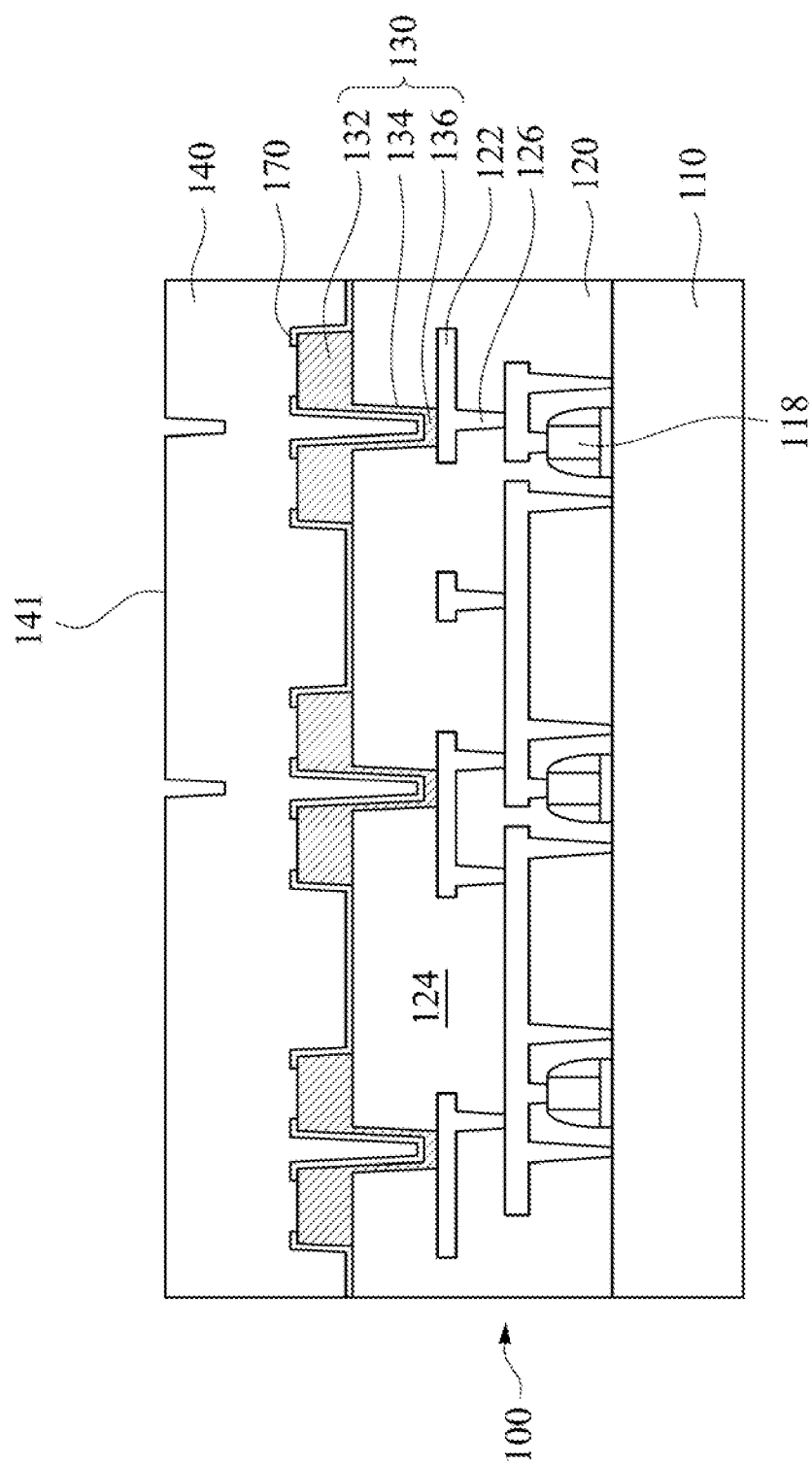

Referring to FIG. 3, a compact layer 140 is formed over the first RDL 130 and the first multi-level interconnect structure 120. In some embodiments, the compact layer 140 is deposited by an ALD process, a CVD process, a PVD process, or other suitable process. Since the compact layer 140 surrounds the first RDL 130 and the compact layer 140 has a good reflow (or filling) capability, void would not be generated/formed in the compact layer 140. For example, a portion of the compact layer 140 between the top portions 132 of the first RDL 130 (i.e., the portion of the compact layer 140 directly above the bottom portion 136 of the first RDL 130) is free from void. As a result, chip warpage of the first chip 100 can be avoided, and thus the surface quality of the first chip 100 for bonding process can be improved. In some embodiments, if a layer overlying and surrounding the first RDL 130 is not formed of compact materials (or flowable materials), void would be generated therein due to a high aspect ratio of the first RDL 130, thereby causing chip warpage of the first chip 100.

In some embodiments, after the compact layer 140 is formed, a plasma process is performed on the compact layer 140 to improve (or enhance) the bond strength in the compact layer 140. The compact layer 140 may then have dopants from the plasma process, and the dopants contain nitrogen, hydrogen and/or oxygen. As such, the surface quality of the first chip 100 for bonding process can be improved.

Figure 4:
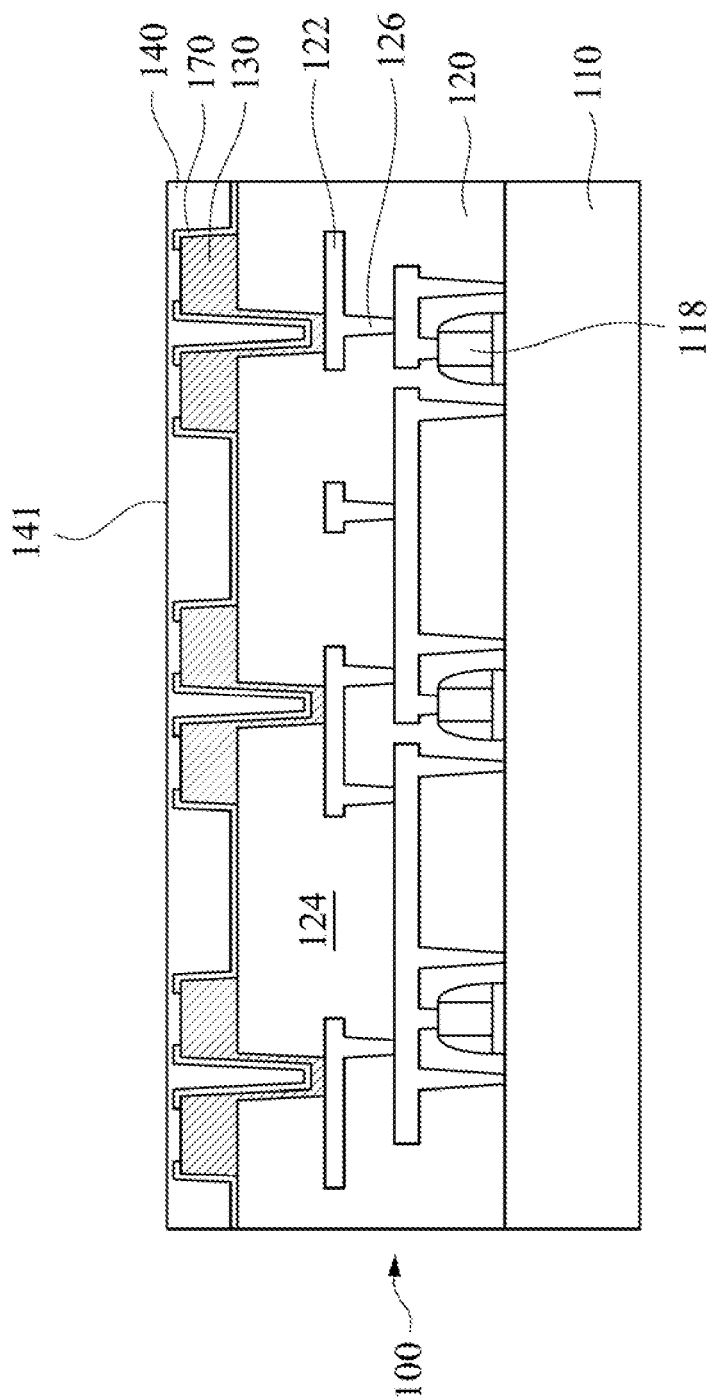

Referring to FIG. 3 and FIG. 4, a planarization process may be performed on a top surface 141 of the compact layer 140 such that a top surface 141 of the compact layer 140 is flat. In some embodiments, the compact layer 140 is thinned. The planarization process may be a chemical mechanical planarization (CMP) process.

Figure 5:
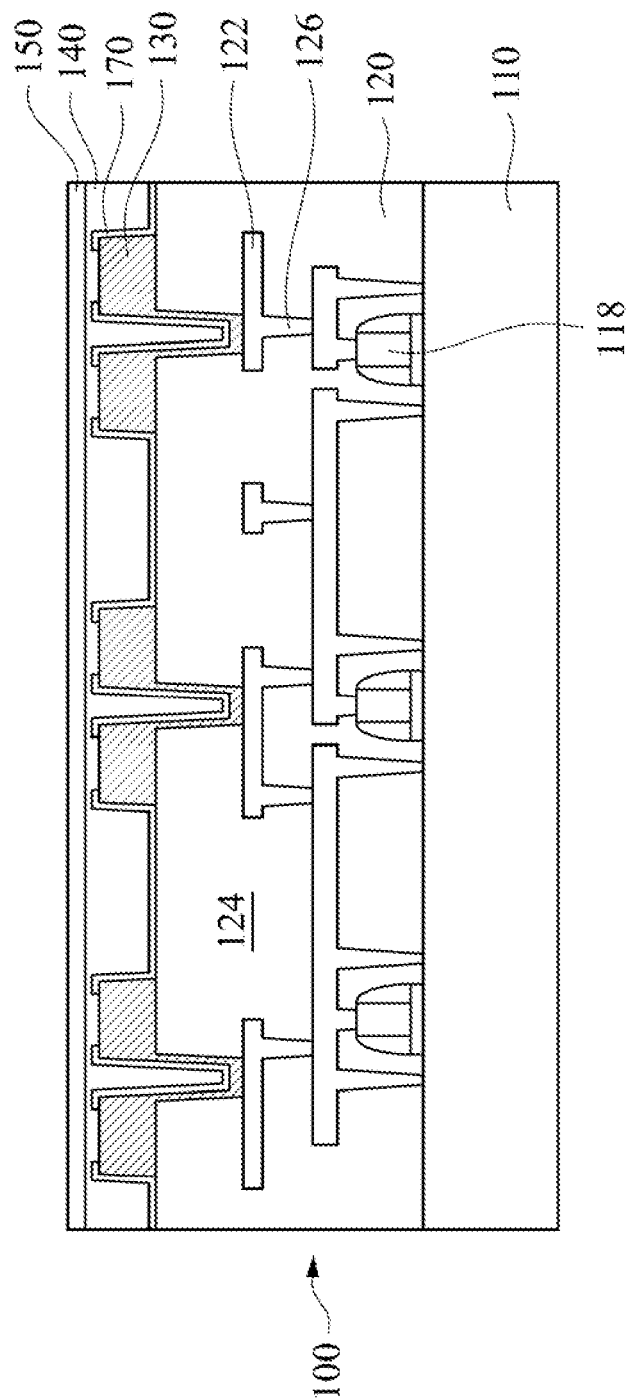

Referring to FIG. 5, the cap layer 150 is formed over and covering the compact layer 140. In some embodiments, the cap layer 150 is selected from the group consisting of silicon, carbon, oxygen, and nitrogen. For example, the cap layer 150 includes silicon carbide, silicon oxide, and/or silicon nitride.

Figure 6:
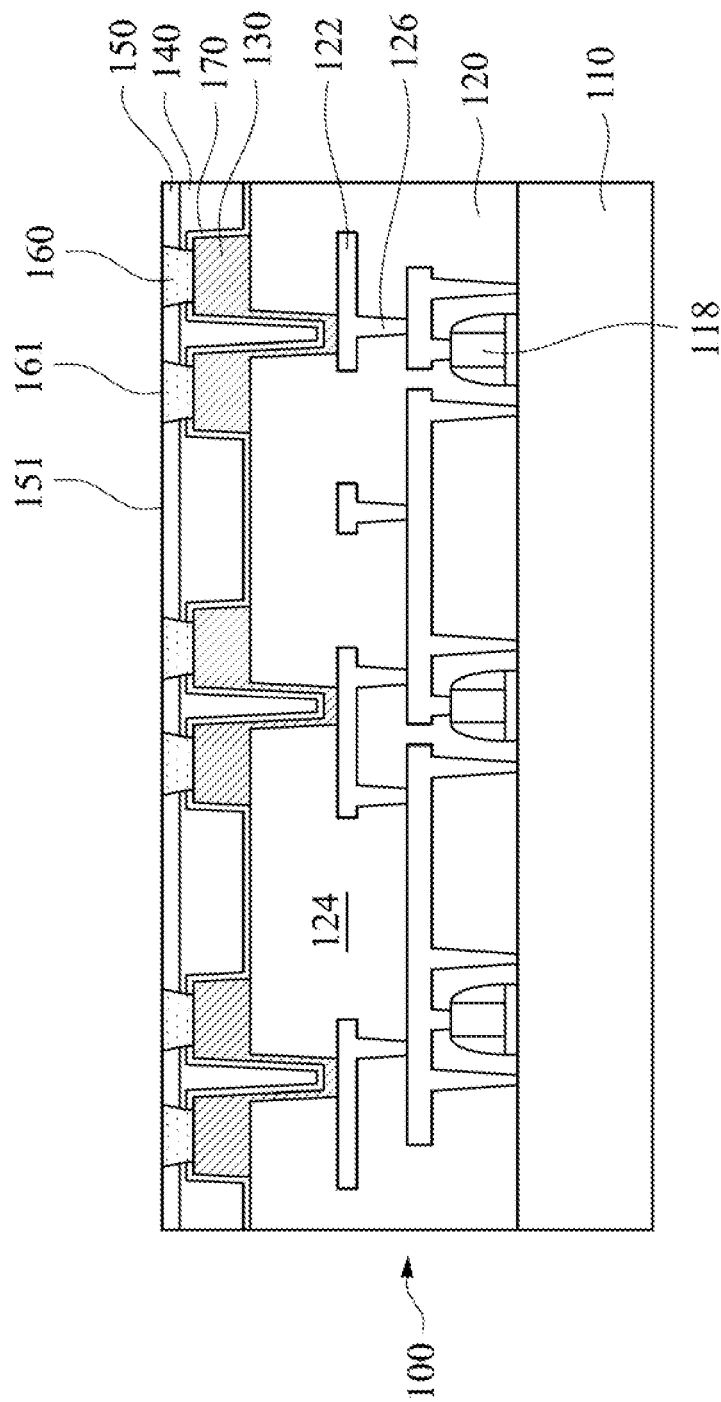

Referring to FIG. 6, the metal pads 160 are formed on the first RDL 130. In some embodiments, the method of forming the metal pads 160 includes etching the cap layer 150 and the compact layer 140 to form openings exposing the first RDL 130, and then filling metal materials into the openings to form the metal pads 160. In some embodiments, a planarization process, such as a CMP process, is performed to remove excess materials. In some embodiments, a top surface 161 of each of the metal pads 160 is substantially coplanar with a top surface 151 of the cap layer. In some embodiments, the metal pads 160 and the first RDL 130 include different materials. In some embodiments, the metal pads 160 include tungsten (W), copper (Cu), or other suitable materials. In embodiments where the metal pad 160s include copper, prior to forming the metal pads 160, a barrier layer and a seed layer may be formed over the first RDL 130, in which the seed layer is conformally formed over the barrier layer and the metal pads 160 are formed over the barrier layer. The barrier layer may be configured to prevent copper diffusion and may be made of tantalum (Ta), tantalum nitride (TaN), titanium nitride (TiN), or other suitable materials. The seed layer serves as an adhesive layer and includes a copper alloy.

Figure 7:
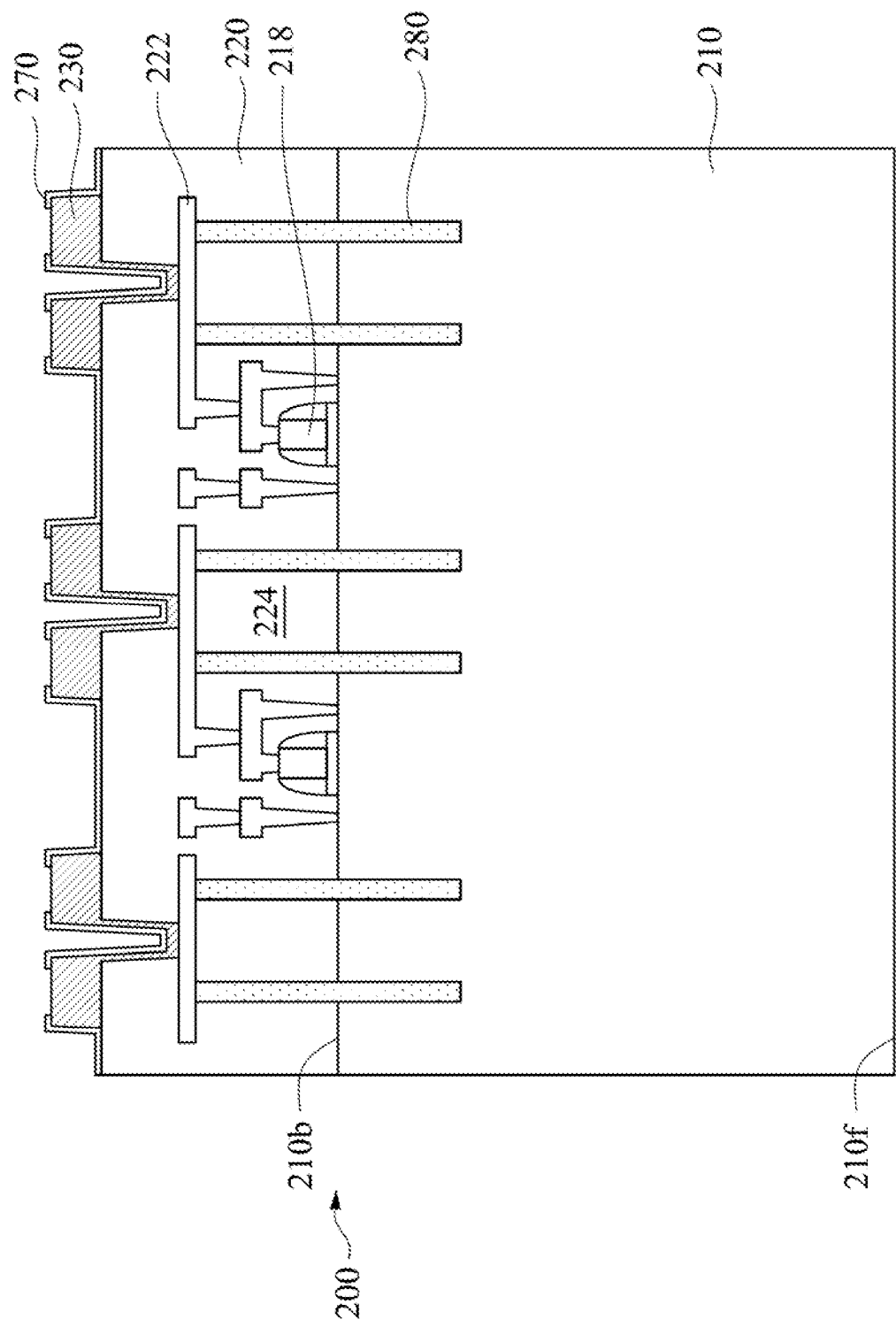

Referring to FIG. 7, the second chip 200 includes the second semiconductor substrate 210, the devices 218, the second multi-level interconnect structure 220, the second RDL 230 and the dielectric layer 270. The second multi-level interconnect structure 220 includes conductive lines 222, IMD layers 224, and conductive vias 226. Materials, configurations, processes and/or operations regarding the second semiconductor substrate 210, the devices 218, the second multi-level interconnect structure 220 (including the conductive lines 222, the IMD layers 224 and conductive vias 226) the second RDL 230 and the dielectric layer 270 of the second chip 200 in FIG. 7 are similar to or the same as the first semiconductor substrate 110, the devices 118, the first multi-level interconnect structure 120 (including the conductive lines 122, the IMD layers 124 and conductive vias 126), the first RDL 130 and the dielectric layer 170 of the first chip 100 in FIGS. 2-6, and, therefore, a description in this regard will not be repeated hereinafter.

In some embodiments, the second chip 200 further includes the conductive structures 280 in the second semiconductor substrate 210 and the second multi-level interconnect structure 220. In some embodiments, the conductive structures 280 include tungsten (W), copper (Cu), or other suitable materials.

Figure 8:
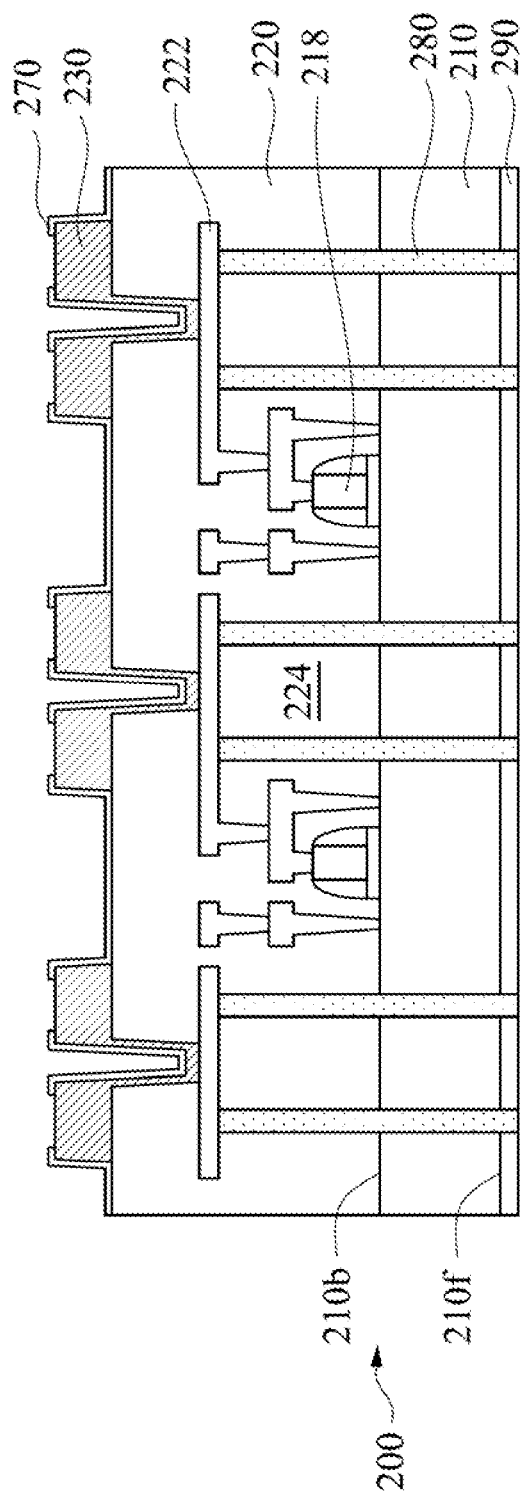

Referring to FIG. 7 and FIG. 8, the second semiconductor substrate 210 of the second chip 200 is thinned. In some embodiments, a grinding process is performed on the front side 210f of the second semiconductor substrate 210 to thin the second semiconductor substrate 210 such that the conductive structures 280 are exposed. After the second semiconductor substrate 210 is thinned, the dielectric layer 290 is formed on the front side 210f of the second semiconductor substrate 210. In some embodiments, a planarization process, such as a CMP process, is performed on the dielectric layer 290 to remove excess materials.

Referring back to FIG. 1, the second chip 200 is bonded to the first chip 100. In some embodiments, bonding the second chip 200 to the first chip 100 includes a hybrid bonding process. The hybrid bonding process involves at least two bonding types, including metal-to-metal bonding and non-metal-to-non-metal bonding. For example, the metal pads 160 and the conductive structures 280 are bonded by metal-to-metal bonding, and the cap layer 150 and the dielectric layer 290 are bonded by non-metal-to-non-metal bonding. As shown in FIG. 1, the combination of the metal pad 160 and the conductive structure 280 has a metallic bonding interface BI between the metal pad 160 and the conductive structure 280 but may not have a clear non-metallic interface between the cap layer 150 and the dielectric layer 290 due to a reflowing process. In some embodiments, the metal pads 160 and the conductive structures 280 include the same materials, and the cap layer 150 and the dielectric layer 290 includes the same materials. In some embodiments, the cap layer 150 and the dielectric layer 290 are referred as bonding layers between the first RDL 130 and the second RDL 230 to bond the first chip 100 and the second chip 200. As a result, the semiconductor structure 10 shown in FIG. 1 can be obtained.

Figure 9:
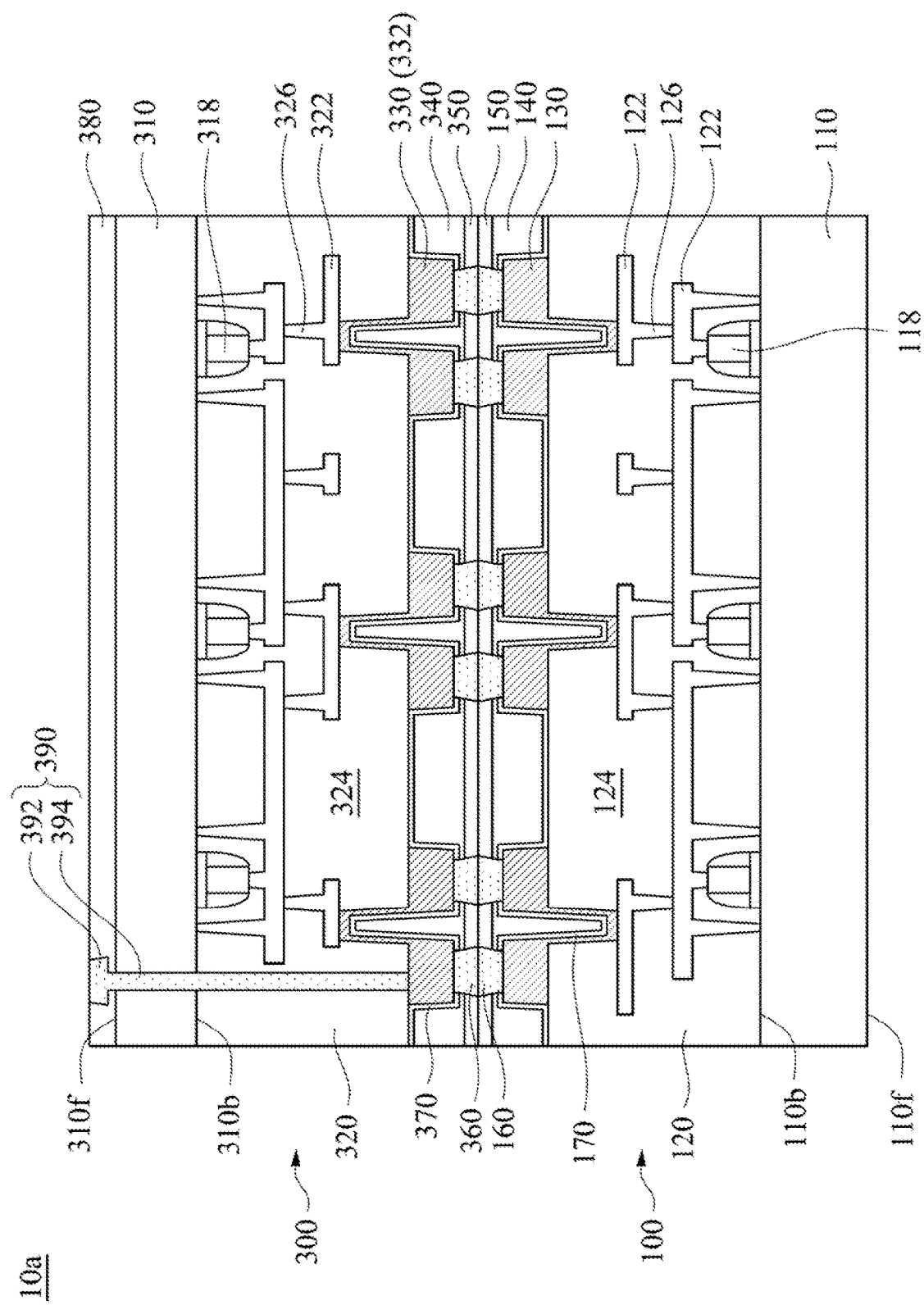
FIG. 9 is a cross-sectional view of a semiconductor structure in accordance with some embodiments of the present disclosure.

FIG. 9 is a cross-sectional view of a semiconductor structure 10a in accordance with some embodiments of the present disclosure. In FIG. 9, the semiconductor structure 10a includes the first chip 100 and a second chip 300. The first chip 100 includes the first semiconductor substrate 110, the devices 118, the first multi-level interconnect structure 120 over the first semiconductor substrate 110, the first RDL 130 over the conductive lines 122 of the first multi-level interconnect structure 120, the compact layer 140 over the first RDL 130 and the first multi-level interconnect structure 120, the cap layer 150 over the compact layer 140, the metal pads 160 on the first RDL 130, and the dielectric layer 170 between the first multi-level interconnect structure 120 and the compact layer 140. The second chip 300 is located over and bonded to the first chip 100. The difference between the semiconductor structure 10a in FIG. 9 and the semiconductor structure 10 in FIG. 1 pertains to configuration of the second chip 300. It is noted that materials, configurations, processes and/or operations regarding the first chip 100 (including the first semiconductor substrate 110, the devices 118, the first multi-level interconnect structure 120, the first RDL 130, the compact layer 140, the cap layer 150, the metal pads 160, and the dielectric layer 170) of FIG. 9 are similar to or the same as those of the first chip 100 of FIG. 1, and, therefore, a description in this regard will not be repeated hereinafter.

The second chip 300 includes a second semiconductor substrate 310, a plurality of devices 318, a second multi-level interconnect structure 320, a second RDL 330, a compact layer 340, a cap layer 350, metal pads 360, and a dielectric layer 370. In some embodiments, the first semiconductor substrate 110 of the first chip 100 has the front side 110f and the back side 110b opposite to the front side 110f, and the second semiconductor substrate 310 of the second chip 300 has the front side 310f and the back side 310b opposite to the front side 310f. The second multi-level interconnect structure 320 is located on the back side 310b of the second semiconductor substrate 310 and connected to the devices 318. The second multi-level interconnect structure 320 includes a plurality of conductive lines 322 that provide interconnections (wiring) between the devices 318, and between conductive lines 322 themselves. The conductive lines 322 may be insulated from each other by inter-metal dielectric (IMD) layers 324. The second multi-level interconnect structure 320 may further include various conductive vias 326 located within the IMD layers 324 for connecting the conductive lines 322.

The second RDL 330 is located on the conductive line 322 of the second multi-level interconnect structure 320. The compact layer 340 surrounds the second RDL 330. The cap layer 350 covers and in contact with the compact layer 340. The metal pads 360 are located on and electrically connected to the second RDL 330. The metal pads 360 are located in the compact layer 340 and the cap layer 350. The metal pads 360 are respectively located on and electrically connected to the metal pads 160 of the first chip 100.

In some embodiments, the second chip 300 is reversed, and a back side of the second chip 300 is bonded to the first chip 100. As such, the first RDL 130 and the second RDL 330 are in mirror symmetry, and the metal pads 160 and the metal pads 360 are in mirror symmetry.

It is noted that materials, configurations, processes and/or operations regarding the second semiconductor substrate 310, the devices 318, the second multi-level interconnect structure 320 (including the conductive lines 322, the IMD layers 324 and the conductive vias 326), the second RDL 330, the compact layer 340, the cap layer 350, the metal pads 360, and the dielectric layer 370 of the second chip 300 are similar to or the same as those of the first semiconductor substrate 110, the devices 118, the first multi-level interconnect structure 120 (including the conductive lines 122, the IMD layers 124 and the conductive vias 126), the first RDL 130, the compact layer 140, the cap layer 150, the metal pads 160, and the dielectric layer 170 of the first chip 100, and, therefore, a description in this regard will not be repeated hereinafter.

For example, the compact layer 340 and the compact layer 140 include the same materials, such as polymer or glass. Since the compact layer 340 covers the second RDL 330 and the compact layer 340 has a good reflow (or filling) capability, void would not be formed in the compact layer 340. For example, a portion of the compact layer 340 between top portions 332 of the second RDL 330 is free from void. With configurations of the compact layer 140 and the compact layer 340, chip warpage of the first chip 100 and/or second chip 300 can be avoided, and thus surface quality of the first chip 100 and/or second chip 300 for bonding process can be improved.

In some embodiments, the second chip 300 further includes a dielectric layer 380 and a conductive structure 390. The dielectric layer 380 is located over the front side 310f of the second semiconductor substrate 310. The conductive structure 390 located in the dielectric layer 380, the second semiconductor substrate 310 and the second multi-level interconnect structure 320. The conductive structure 390 extends upward from second RDL 330 to the second semiconductor substrate 310. In greater details, the conductive structure 390 includes a top portion 392 and a bottom portion 394, in which the top portion 392 is wider than the bottom portion 394. The bottom portion 394 of the conductive structure 390 is electrically connected to the second RDL 330, and the top portion 392 of the conductive structure 390 is electrically connected to other external circuits (not shown). The top portion 392 of the conductive structure 390 is surrounded by the dielectric layer 380, while the bottom portion 394 of the conductive structure 390 is surrounded by the dielectric layer 380, the second semiconductor substrate 310 and the second multi-level interconnect structure 320. The conductive structure 390 may be referred as a through-substrate via.

Figure 10:
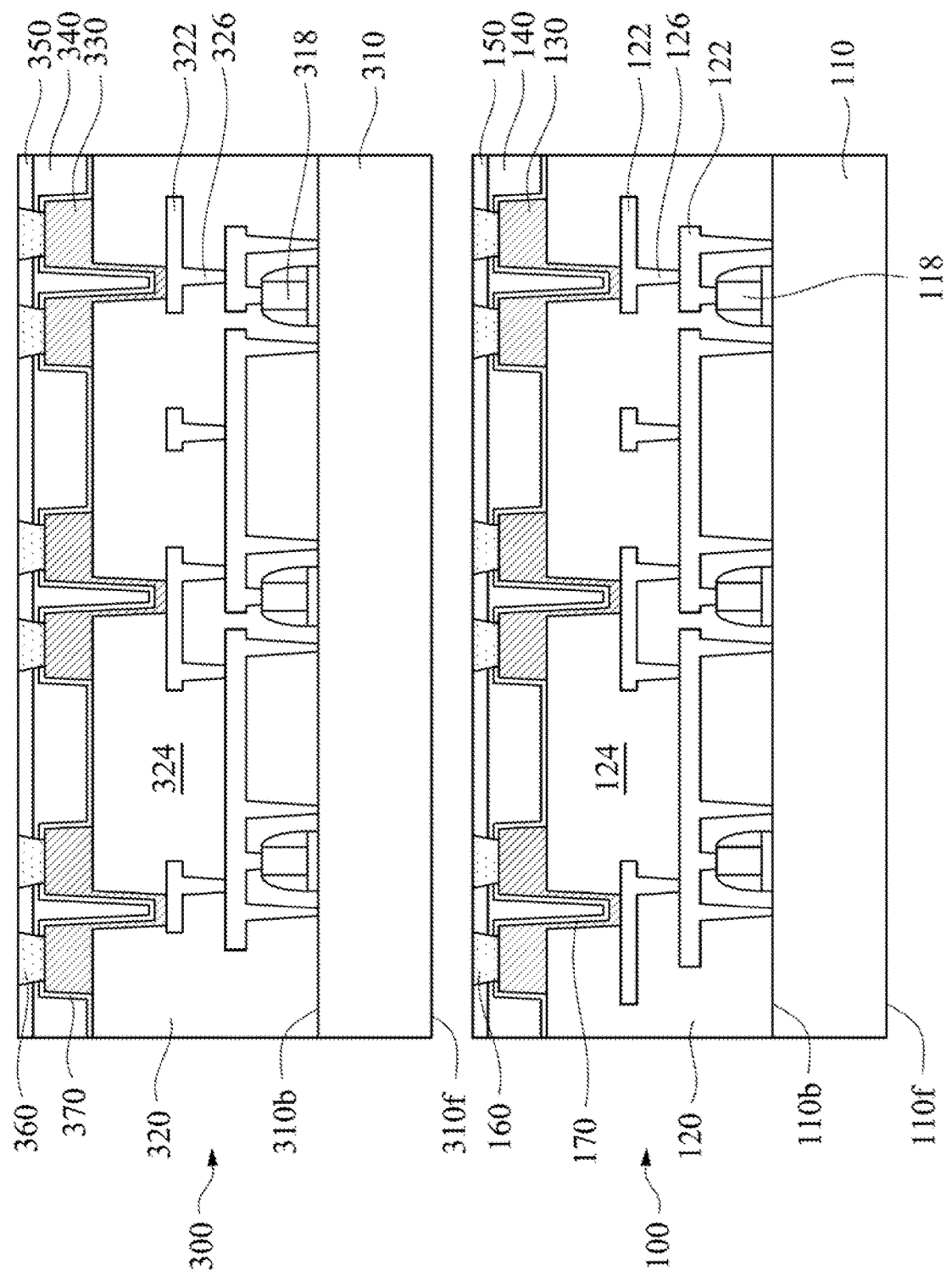
FIGS. 10-12 are cross-sectional views of a method of forming the semiconductor structure at various stages in accordance with some embodiments of the present disclosure.
Figure 11:
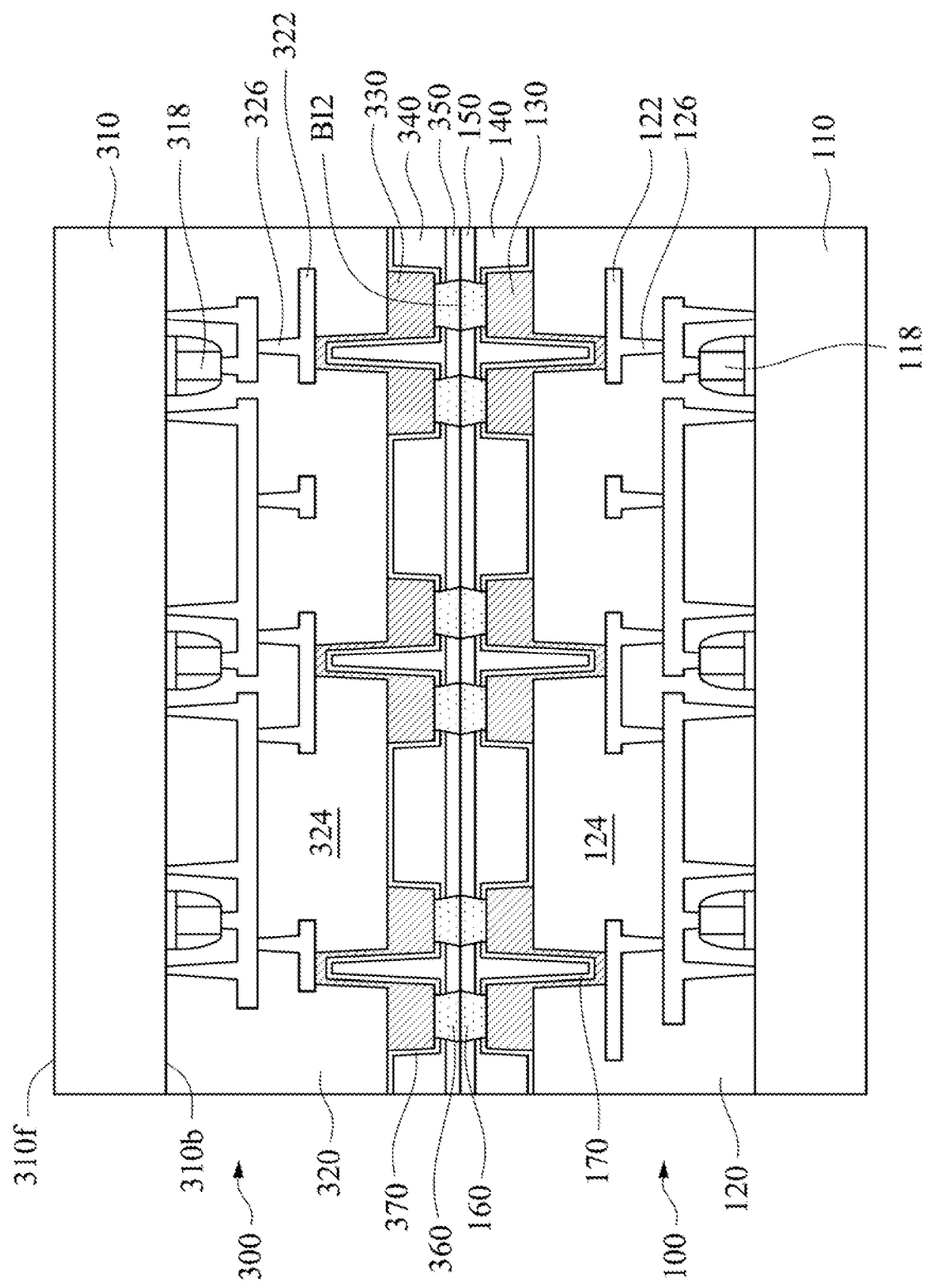
Figure 12:
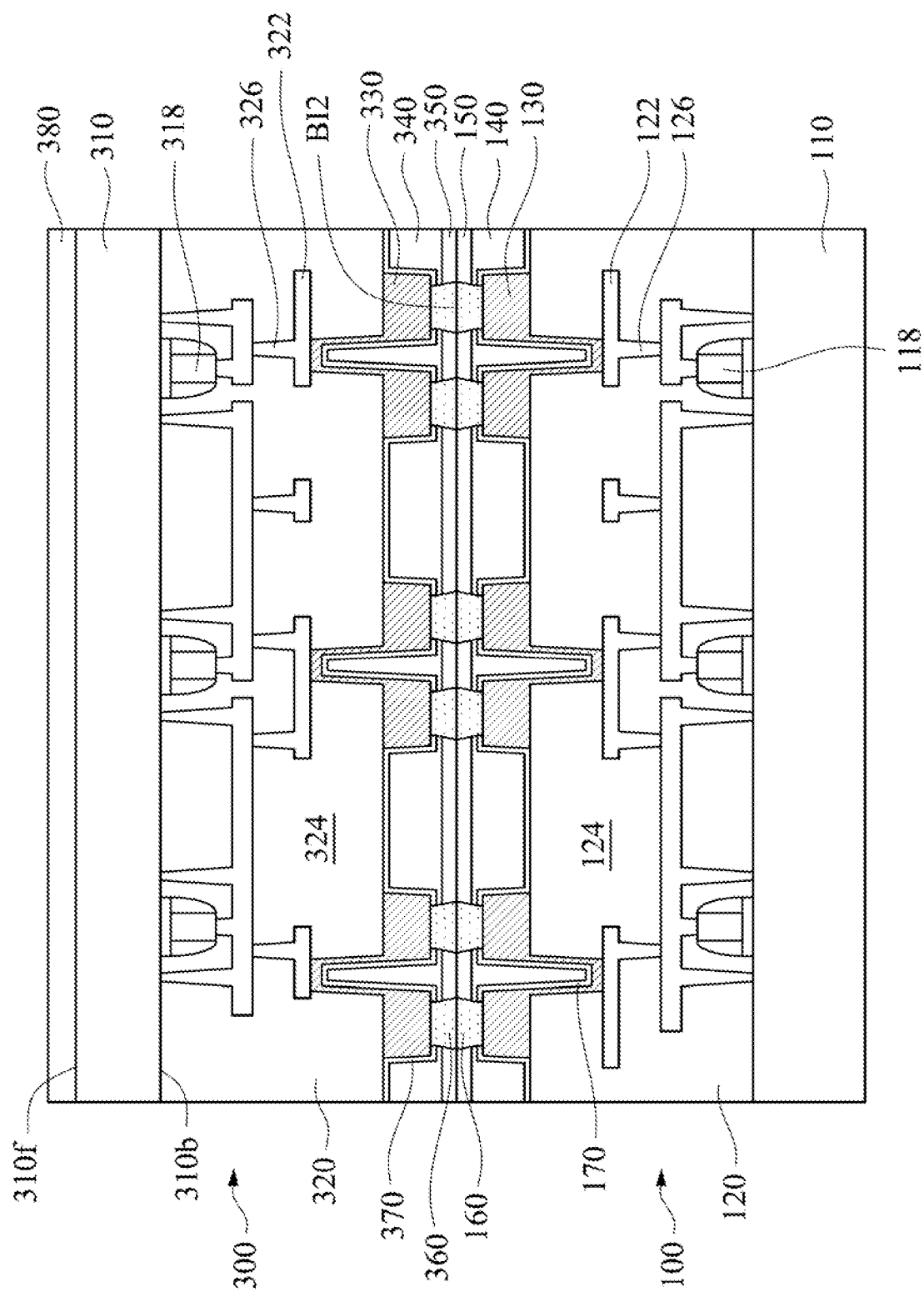

FIGS. 10-12 are cross-sectional views of a method of forming the semiconductor structure 10a of FIG. 9 at various stages in accordance with some embodiments of the present disclosure.

Referring to FIG. 10, the fabricating processes of the first chip 100 is similar to the fabricating processes in FIGS. 2-6. The devices 118 are formed over the first semiconductor substrate 110, and the first multi-level interconnect structure 120 is formed above the devices 118. The first RDL 130 is formed over the first multi-level interconnect structure 120, and the dielectric layer 170 is formed over the first RDL 130. The compact layer 140 is formed over the first RDL 130 and the first multi-level interconnect structure 120. The planarization process may be performed on the compact layer 140 to remove excess materials. The cap layer 150 is formed over the compact layer 140. The metal pads 160 are formed on the first RDL 130.

In some embodiments, fabricating processes of the second chip 300 is similar to the fabricating processes of the first chip 100. The devices 318 are formed over the second semiconductor substrate 310, and the second multi-level interconnect structure 320 is formed above the devices 318. The second RDL 330 is formed over the second multi-level interconnect structure 320, and the dielectric layer 370 is formed over the second RDL 330. The compact layer 340 is formed over the second RDL 330 and the second multi-level interconnect structure 320. The planarization process may be performed on the compact layer 340 to remove excess materials. The cap layer 350 is formed over the compact layer 340. The metal pads 160 are formed on the second RDL 330.

Referring to FIG. 11, the second chip 300 is then reversed such that the second multi-level interconnect structure 320 is below the second semiconductor substrate 310, the second RDL 330 is below the second multi-level interconnect structure 320, and the metal pad 360 is below the second RDL 330.

Thereafter, the second chip 300 is bonded to the first chip 100. In some embodiments, bonding the second chip 300 to the first chip 100 includes a hybrid bonding process. The hybrid bonding process involves at least two bonding types, including metal-to-metal bonding and non-metal-to-non-metal bonding. For example, the metal pads 360 and the metal pads 160 are bonded by metal-to-metal bonding, and the cap layer 350 and the cap layer 150 are bonded by non-metal-to-non-metal bonding. As shown in FIG. 12, the combination of the metal pad 360 and the metal pad 160 has a metallic bonding interface BI2 between the metal pad 360 and the metal pad 160 but may not have a clear non-metallic interface between the cap layer 350 and the cap layer 150 due to a reflowing process. In some embodiments, the metal pad 360 and the metal pad 160 includes the same materials, and the cap layer 350 and the cap layer 350 includes the same materials. In some embodiments, the cap layer 150 and the cap layer 350 are referred as bonding layers between the first RDL 130 and the second RDL 330 to bond the first chip 100 and the second chip 300.

Referring to FIG. 12, the second semiconductor substrate 310 of the second chip 300 is thinned. In some embodiments, a grinding process is performed on the front side 310f of the second semiconductor substrate 310 to thin the second semiconductor substrate 310. After the second semiconductor substrate 310 is thinned, the dielectric layer 380 is formed on the front side 310f of the second semiconductor substrate 310. In some embodiments, the dielectric layer 380 is deposited by an ALD process, a CVD process, a subatmospheric CVD (SACVD) process, a flowable CVD process, a PVD process, or other suitable process. The dielectric layer 380 may be made of silicon oxide, silicon nitride, silicon oxynitride, or other suitable materials. In some embodiments, the dielectric layer 380 and the IMD layers 324 of the second multi-level interconnect structure 320 include the same materials, such as silicon oxide. In some embodiments, a planarization process, such as a CMP process, is performed on the dielectric layer 380 to remove excess materials.

Referring back to FIG. 9, after the dielectric layer 380 is formed, the conductive structure 390 is formed in the dielectric layer 380, the second semiconductor substrate 310, and the second multi-level interconnect structure 320. The method of forming the conductive structure 390 includes etching the dielectric layer 380, the second semiconductor substrate 310, and the second multi-level interconnect structure 320 (IMD layers 324) to form an opening exposing the second RDL 330, and then filling conductive materials into the opening to form the conductive structure 390. As a result, the semiconductor structure 10 shown in FIG. 9 can be obtained.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
   a first chip comprising:
      a first semiconductor substrate;
      a first multi-level interconnect structure over the first semiconductor substrate, the first multi-level interconnect structure comprising a conductive line;
      a first redistribution layer (RDL) over the conductive line of the first multi-level interconnect structure;
      a compact layer over the first RDL and the first multi-level interconnect structure, wherein the compact layer has a portion within the first multi-level interconnect structure;
      a cap layer over the compact layer; and
      a metal pad on the first RDL; and
   a second chip bonded to the first chip, the second chip comprising:
      a second semiconductor substrate;
      a second multi-level interconnect structure over the second semiconductor substrate; and
   a conductive structure extending from the second multi-level interconnect structure to the metal pad.

2. The semiconductor structure of claim 1, wherein the compact layer is made of polymer or glass.

3. The semiconductor structure of claim 1, wherein the compact layer has dopants containing nitrogen, hydrogen or oxygen.

4. The semiconductor structure of claim 1, wherein the cap layer is in contact with the compact layer.

5. The semiconductor structure of claim 1, wherein the compact layer is in contact with the metal pad.

6. The semiconductor structure of claim 1, wherein the first chip further comprises a dielectric layer between the compact layer and the first multi-level interconnect structure.

7. The semiconductor structure of claim 1, wherein the cap layer is selected from the group consisting of silicon, carbon, oxygen, and nitrogen.

8. The semiconductor structure of claim 1, wherein the first RDL comprises:
   a top portion;
   a bottom portion; and
   a neck portion between the top portion and the bottom portion, wherein the top portion is thicker than the bottom portion.

9. The semiconductor structure of claim 8, wherein the neck portion and the bottom portion of the first RDL are within the first multi-level interconnect structure.

10. The semiconductor structure of claim 1, wherein the second chip comprises a second RDL over the second multi-level interconnect structure.

11. The semiconductor structure of claim 1, wherein the second chip comprises a dielectric layer between the second semiconductor substrate and the cap layer, wherein the dielectric layer and the cap layer include a same material.

12. A semiconductor structure, comprising:
    a first chip comprising:
       a first semiconductor substrate;
       a first multi-level interconnect structure over the first semiconductor substrate, the first multi-level interconnect structure comprising a conductive line;
       a first redistribution layer (RDL) over the conductive line of the first multi-level interconnect structure;
       a compact layer over the first RDL and the first multi-level interconnect structure;
       a cap layer over the compact layer; and
       a metal pad on the first RDL, wherein the compact layer is in contact with the metal pad; and
    a second chip bonded to the first chip, the second chip comprising:
       a second semiconductor substrate;
       a second multi-level interconnect structure over the second semiconductor substrate; and
    a conductive structure extending from the second multi-level interconnect structure to the metal pad.

* * * * *